United States Patent
Kodera et al.

(10) Patent No.: US 8,803,501 B2
(45) Date of Patent: Aug. 12, 2014

(54) POWER SUPPLY APPARATUS FOR TEST APPARATUS

(75) Inventors: Satoshi Kodera, Tokyo (JP); Takahiko Shimizu, Tokyo (JP)

(73) Assignee: Advantest Corporation, Tokyo (JP)

( * ) Notice: Subject to any disclaimer, the term of this patent is extended or adjusted under 35 U.S.C. 154(b) by 283 days.

(21) Appl. No.: 13/219,566

(22) Filed: Aug. 26, 2011

(65) Prior Publication Data
US 2012/0049893 A1 Mar. 1, 2012

(30) Foreign Application Priority Data

Aug. 31, 2010 (JP) ................................. 2010-194348

(51) Int. Cl.
*G05F 1/10* (2006.01)
(52) U.S. Cl.
USPC ............................ 323/285; 323/281; 323/283
(58) Field of Classification Search
CPC .............................. G05F 1/10; G01R 31/2839
USPC ......................................... 323/281–285, 288
See application file for complete search history.

(56) References Cited

U.S. PATENT DOCUMENTS

| 6,016,257 | A * | 1/2000 | Chang et al. | 363/17 |
| 7,138,819 | B2 * | 11/2006 | Hashimoto | 324/762.02 |
| 7,616,049 | B2 * | 11/2009 | Yoon | 327/536 |
| 2009/0015221 | A1 * | 1/2009 | Kodera | 323/279 |

FOREIGN PATENT DOCUMENTS

JP 07-260859 10/1995

* cited by examiner

*Primary Examiner* — Matthew Nguyen
(74) *Attorney, Agent, or Firm* — Ladas & Parry, LLP

(57) ABSTRACT

A voltage source generates a power supply voltage $V_{OUT}$ stabilized such that it matches the voltage level that corresponds to a reference voltage $V_{REF}$, and supplies the power supply voltage to a DUT. A current detection circuit generates a detection voltage Vm that corresponds to an output current $I_{OUT}$ that flows through the DUT. In the initial state, the reference voltage $V_{REF}$ generated by a reference voltage generating circuit is set to an initial voltage level that corresponds to an input voltage $V_{IN}$. After the output current $I_{OUT}$ flows, the reference voltage transits to a first voltage level $V_{L1}$ obtained by shifting the initial voltage level by a first voltage step that corresponds to the detection voltage Vm. Subsequently, the reference voltage $V_{REF}$ transits to a second voltage level $V_{L2}$ obtained by shifting the initial voltage level by a second voltage step that corresponds to the detection voltage Vm.

20 Claims, 10 Drawing Sheets

POWER SUPPLY APPARATUS FOR TEST APPARATUS

CROSS-REFERENCE TO RELATED APPLICATIONS

This application claims to priority to Japanese Patent Application No. 2010-194348 filed on Aug. 31, 2010 the disclosure of which is incorporated herein by reference.

BACKGROUND OF THE INVENTION

1. Field of the Invention

The present invention relates to a power supply apparatus configured to supply a power supply voltage to a device under test.

2. Description of the Related Art

FIG. 1 is a circuit diagram which shows a configuration of a test apparatus according to a related art. A test apparatus $2r$ is configured to supply a power supply voltage $V_{OUT}$ to a device under test (DUT) 1, and to measure a load current $I_{OUT}$ that flows through the DUT 1 in the operating state.

The test apparatus $2r$ includes: a power supply apparatus $4r$ configured to generate the power supply voltage $V_{OUT}$ to be supplied to the DUT 1; and a current measurement circuit $6r$ configured to measure the current $I_{OUT}$ that flows through the DUT 1. A smoothing decoupling capacitor CL is arranged in the vicinity of the DUT 1 between a power supply terminal P2 and a ground terminal. An output terminal P1 of the power supply apparatus $4r$ and the power supply terminal P2 of the DUT 1 are connected via a cable of a certain length. Such a transmission path that comprises such a cable functions as a parasitic impedance 3 that affects the power supply apparatus $4r$.

The power supply apparatus $4r$ includes a D/A converter 8 and a voltage source 10.

The D/A converter 8 receives, from an unshown signal processing unit, a digital value $D_{IN}$ that corresponds to the target value of the output voltage $V_{OUT}$, and outputs an analog input voltage $V_{IN}$. The voltage source 10 generates the power supply voltage $V_{OUT}$ that corresponds to the input voltage $V_{IN}$. The voltage source 10 includes an operational amplifier A1, a buffer A2, a buffer A3, a phase compensation circuit 12, an input resistor Ri, and a feedback resistor Rf. The voltage source 10 is configured as an inverting amplifier, and is configured to invert the negative input voltage $V_{IN}$ so as to output the positive power supply voltage $V_{OUT}$. Specifically, the voltage source 10 stabilizes its output voltage $V_{OUT}$ to the target level obtained by multiplying the input voltage $V_{IN}$ by a negative coefficient. With the power supply apparatus $4r$ shown in FIG. 1, a feedback operation is performed so as to satisfy the following Expression.

$$V_{OUT}/Rf + V_{IN}/Ri = 0 \quad (1)$$

Thus, the target value of the output voltage $V_{OUT}$ is represented by the following Expression (2).

$$V_{OUT} = -Rf/Ri \times V_{IN} \quad (2)$$

The current measurement circuit $6r$ includes a current detection resistor Rm, an amplifier 22, and an A/D converter 24. The current detection resistor Rm is arranged on a path of the output current $I_{OUT}$. A voltage drop, which is proportional to the output current $I_{OUT}$, occurs at the current detection resistor Rm. The amplifier 22 amplifies the voltage drop that occurs at the current detection resistor Rm. The A/D converter 24 converts the voltage thus amplified by the amplifier 22 into a digital value. The digital value thus converted exhibits a value that is proportional to the output current $I_{OUT}$.

In many cases, between a product (set) mounting the DUT 1 in practice and the test apparatus $2r$, there is a difference in the capacity and the performance of a power supply circuit (which will be referred to as the "set power supply") which is used to supply a power supply voltage to the DUT 1. In order to solve such a problem, the user desires a test apparatus $2r$ that supplies the power supply voltage $V_{OUT}$ to the DUT 1 in the test operation for the DUT 1 in conditions that are more similar to those of the actual product. In order to meet such a requirement, there is a demand for the test apparatus $2r$ to have a function for emulating the performance of such a set power supply.

RELATED ART DOCUMENTS

Patent Documents

[Patent Document 1]
Japanese Patent Application Laid Open No. H07-260859

With such a test apparatus $2r$ shown in FIG. 1, such an arrangement is capable of emulating the performance of the set power supply by changing the characteristics of the phase compensation circuit 12. With such an approach, such an arrangement is capable of changing the responsiveness (response speed) with respect to load fluctuation. However, such an arrangement is not capable of emulating other characteristics. Furthermore, this approach affects the feedback loop, which damages the stability of the system. In some cases, this leads to unintended oscillation.

The present applicant has proposed another approach in Patent document 1. With such a technique described in Patent document 1, by feeding back a signal that corresponds to the output current $I_{OUT}$ to the operational amplifier A1, such an arrangement emulates changes in the output resistance of the power supply apparatus.

There is a demand for an arrangement which is capable of changing other characteristics in addition to the output resistance of the power supply apparatus. Such an arrangement is capable of emulating the performance of the set power supply in a more precise and more flexible manner, which is convenient.

SUMMARY OF THE INVENTION

The present invention has been made in order to solve such a problem. Accordingly, it is an exemplary purpose of an embodiment of the present invention to provide a power supply apparatus which is capable of emulating the performance of a set power supply in a flexible manner.

An embodiment of the present invention relates to a power supply apparatus for a test apparatus, configured to supply a power supply voltage to a device under test. The power supply apparatus comprises: a voltage source configured to generate the power supply voltage stabilized such that its voltage level matches a voltage level that corresponds to a reference voltage, and to supply the power supply voltage thus generated to the device under test; a current detection circuit configured to generate a detection voltage that corresponds to an output current that flows through the device under test; and a reference voltage generating circuit configured to generate the reference voltage according to an input voltage and the detection voltage. The reference voltage generating circuit is configured to generate the reference voltage such that, in an initial state, the reference voltage is set to an initial voltage level that corresponds to the input voltage, and such that, after the output current flows, the reference voltage transits to a first voltage level obtained by shifting the initial voltage level by a first voltage step that corresponds to the detection voltage, following which the reference voltage transits to a second voltage level obtained by shifting the initial voltage level by a second voltage step that corresponds to the detection voltage.

With such an embodiment, the reference voltage sequentially transits according to the output current, in order from the initial voltage level, to the first voltage level, to the second voltage level. Accordingly, the power supply voltage transits such that it follows the reference voltage. This allows the power supply apparatus to emulate the characteristics of various kinds of set power supplies.

Also, the reference voltage generating circuit may be configured to be capable of adjusting at least one from among the first voltage step and the second voltage step. Also, the reference voltage generating circuit may be configured to be capable of adjusting the settling time required for the reference voltage to transit from the first voltage level to the second voltage level.

Another embodiment of the present invention also relates to a power supply apparatus. The power supply apparatus comprises: a voltage source configured to generate a power supply voltage stabilized such that its voltage level matches a voltage level that corresponds to a reference voltage, and to supply the power supply voltage thus generated to a device under test; a current detection circuit configured to generate a detection voltage that corresponds to an output current that flows through the device under test; and a reference voltage generating circuit configured to receive an input voltage and the detection voltage, and to generate the reference voltage.

With the component of the reference voltage that corresponds to the detection voltage as $V_{REF}'$, the reference voltage generating circuit is configured to provide a transfer function H(s) represented by $V_{REF}'=H(s) \times Vm=(K_1-K_2/(1+s \cdot K_3)) \times Vm$, where Vm represents the detection voltage, and $K_1$, $K_2$, and $K_3$ each represent a coefficient. Here "s" represents an Laplace operator (jω).

Such an embodiment is capable of emulating the characteristics of various kinds of set power supplies.

Yet another embodiment of the present invention also relates to a power supply apparatus. The power supply apparatus comprises: a voltage source configured to generate the power supply voltage stabilized such that its voltage level matches a voltage level that corresponds to a reference voltage, and to supply the power supply voltage thus generated to the device under test; a current detection circuit configured to generate a detection voltage that corresponds to an output current that flows through the device under test; and a reference voltage generating circuit configured to generate the reference voltage. The reference voltage generating circuit comprises an A/D converter configured to convert the detection voltage into a digital detection value, a signal processing unit configured to perform signal processing on the digital detection value so as to generate a digital reference value that corresponds to the reference voltage, and a D/A converter configured to convert the digital reference value into the reference voltage in the form of an analog signal. The signal processing unit is configured to generate the digital reference value such that, in the initial state, the digital reference value is set to an initial level, and such that, after the output current flows, the digital reference value transits to a first level obtained by shifting the initial level by a first step that corresponds to the digital detection value, following which it transits to a second level obtained by shifting the initial level by a second step that corresponds to the digital detection value.

Yet another embodiment of the present invention relates to a test apparatus. The test apparatus comprises a power supply apparatus according to any one of the aforementioned embodiments, configured to supply electric power to a device under test.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
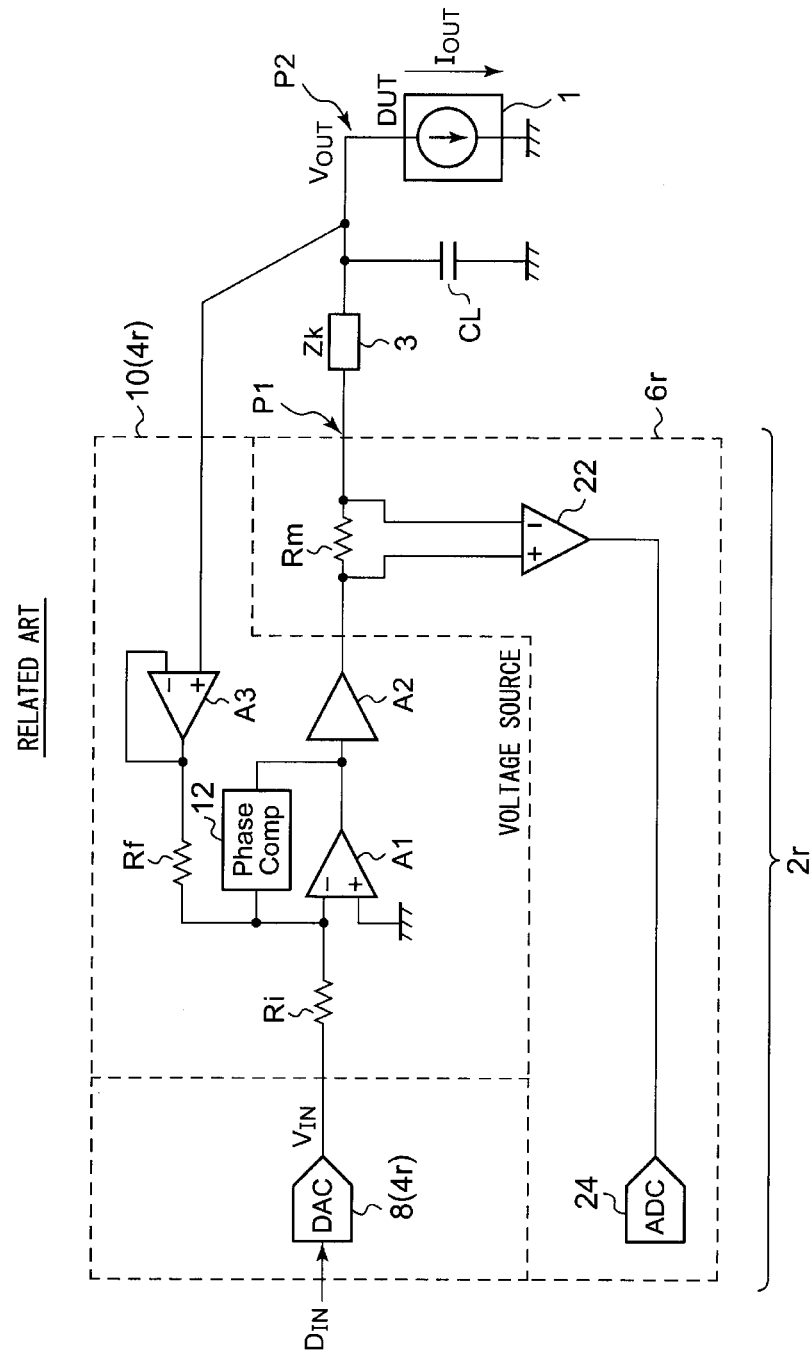
FIG. 1 is a circuit diagram which shows a configuration of a test apparatus according to a related art.
Figure 2:
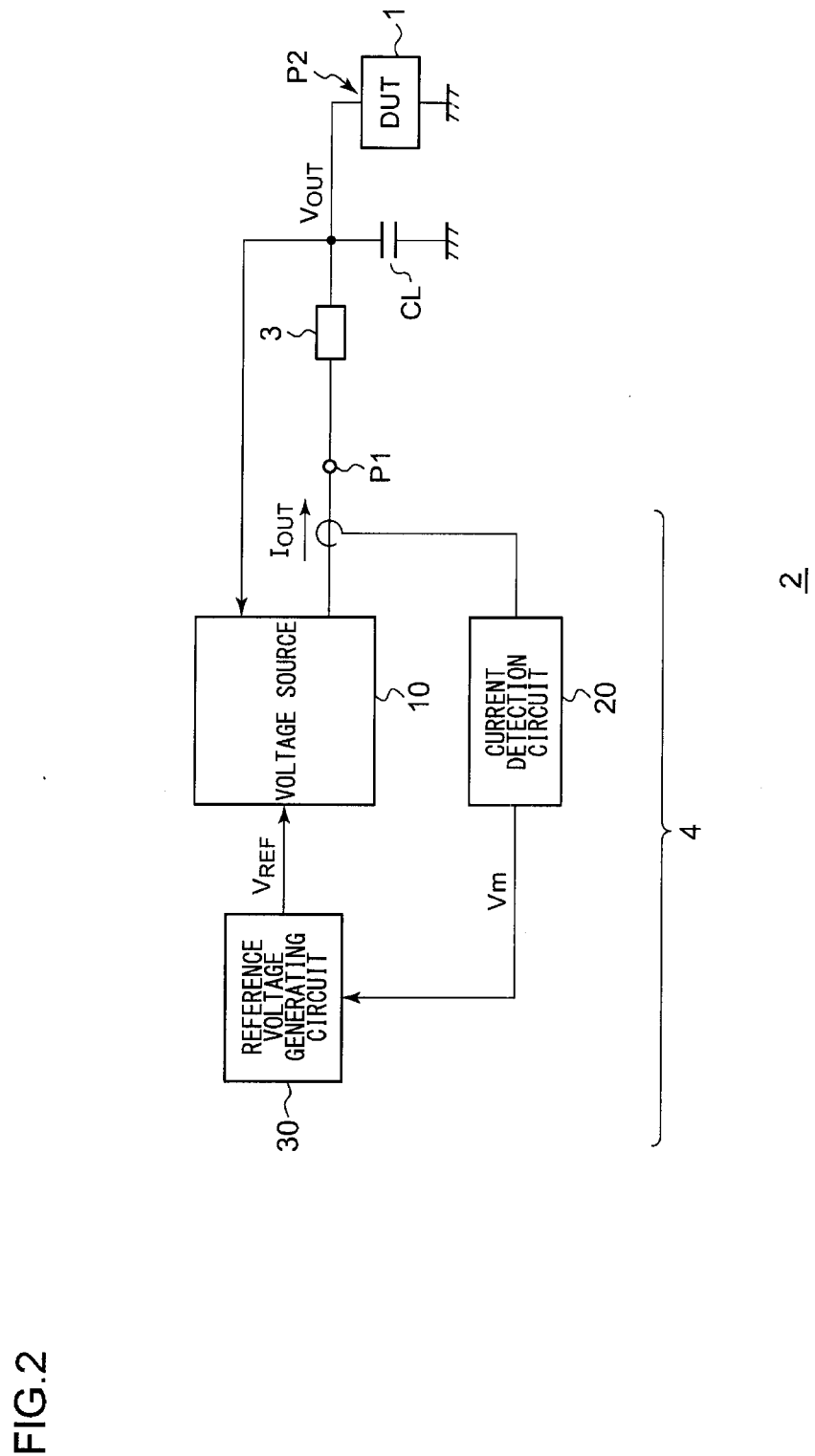
FIG. 2 is a block diagram which shows a configuration of a test apparatus including a power supply apparatus according to an embodiment.

FIG. 2 is a block diagram which shows a configuration of a test apparatus 2 including a power supply apparatus 4 according to an embodiment. In addition to the test apparatus 2, FIG. 2 shows a DUT 1 which is to be tested. An output terminal P1 of the power supply apparatus 4 and a power supply terminal P2 of the DUT 1 are connected via a cable 3. The power supply voltage $V_{OUT}$ generated by the power supply apparatus 4 is supplied to the power supply terminal P2 of the DUT 1 via a parasitic impedance due to the cable 3. A decoupling capacitor CL is arranged in the vicinity of the DUT 1.

The power supply apparatus 4 includes a voltage source 10, a current detection circuit 20, and a reference voltage generating circuit 30. The power supply voltage $V_{OUT}$ supplied to the DUT 1 is fed back to the voltage source 10. The voltage source 10 adjusts the power supply voltage $V_{OUT}$ by means of a feedback operation such that the power supply voltage $V_{OUT}$ matches a target voltage level that corresponds to a reference voltage $V_{REF}$.

The current detection circuit 20 generates a detection voltage Vm that corresponds to an output current $I_{OUT}$ that flows from the power supply apparatus 4 to the DUT 1. The reference voltage generating circuit 30 generates the reference voltage $V_{REF}$ according to an input voltage $V_{IN}$ and the detection voltage Vm.

The reference voltage $V_{REF}$ generated by the reference voltage generating circuit 30 possesses the following characteristics.

(1) In the initial state, the reference voltage $V_{REF}$ exhibits an initial voltage level $V_{INIT}$ that corresponds to the input voltage $V_{IN}$.

(2) After the output voltage $I_{OUT}$ flows, the reference voltage transits from the initial voltage level $V_{INIT}$ to a first voltage level $V_{L1}$. The first voltage level $V_{L1}$ is a level obtained by shifting the initial voltage level $V_{INIT}$ by a first voltage step $\Delta V_1$ that is proportional to the detection voltage Vm. For example, the first voltage step $\Delta V_1$ is represented by $\Delta V_1 = Vm \times \alpha$. Here, $\alpha$ represents a coefficient.

(3) Subsequently, the reference voltage $V_{REF}$ transits from the first voltage level $V_{L1}$ to a second voltage level $VL_2$. The second voltage level $VL_2$ is a level obtained by shifting the initial voltage level $V_{INIT}$ by a second voltage step $\Delta V_2$ that is proportional to the detection voltage Vm. For example, the second voltage step $\Delta V_2$ is represented by $\Delta V_2 = Vm \times \beta$. Here, $\beta$ represents a coefficient.

The reference voltage generating circuit 30 is configured to be capable of adjusting at least one of either the first voltage step $\Delta V_1$ or the second voltage step $\Delta V_2$, i.e., at least one of either of the coefficients $\alpha$ or $\beta$. More preferably, the reference voltage generating circuit 30 is configured to be capable of adjusting them both. Furthermore, the reference voltage generating circuit 30 is configured to be capable of adjusting the settling time Ts required to switch the voltage level from the first voltage level $V_{L1}$ to the second voltage level $VL_2$.

Figure 3:
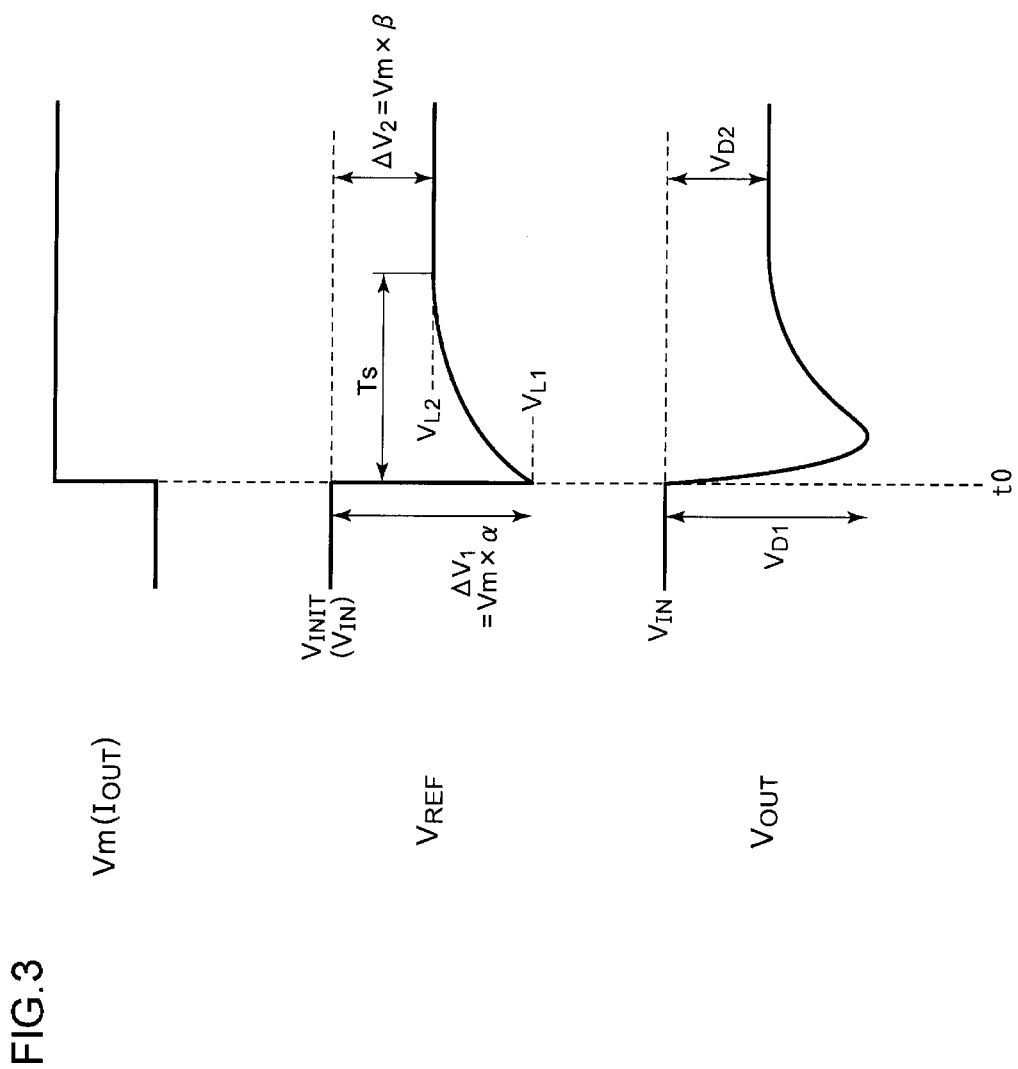
FIG. 3 is a time chart which shows the operation of the power supply apparatus shown in FIG. 2.

The above is the basic configuration of the power supply apparatus 4 according to the embodiment. Next, description will be made regarding the operation thereof. FIG. 3 is a time chart which shows the operation of the power supply apparatus 4 shown in FIG. 2.

Before the time point t0, the power supply apparatus 4 is in the initial state in which the output current $I_{OUT}=0$, and the reference voltage $V_{REF}$ exhibits the initial voltage level $V_{INIT}$ that corresponds to the input voltage $V_{IN}$.

At the time point t0, the DUT 1 starts to operate, and the output current $I_{OUT}$ flows. In this state, the reference voltage $V_{REF}$ transits to the first voltage level $V_{L1}$. Subsequently, after a given settling time Ts elapses, the reference voltage $V_{REF}$ transits to the second voltage level $VL_2$.

The voltage source 10 performs a feedback control operation such that the power supply voltage $V_{OUT}$ matches a target voltage level that corresponds to the reference voltage $V_{REF}$. As a result, the amount of drop $V_{D1}$ of the power supply voltage $V_{OUT}$ immediately after the time point t0 corresponds to the first voltage step $\Delta V_1$. Furthermore, the amount of drop $V_{D2}$ of the power supply voltage $V_{OUT}$ after the settling corresponds to the second voltage step $\Delta V_2$.

That is to say, with the power supply apparatus 4 shown in FIG. 2, by adjusting the voltage steps $\Delta V_1$ and $\Delta V_2$ or the settling time Ts, such an arrangement is capable of emulating various kinds of set power supplies in a flexible manner.

Description will be made below regarding a specific example configuration of the voltage source 10.

Figure 4:
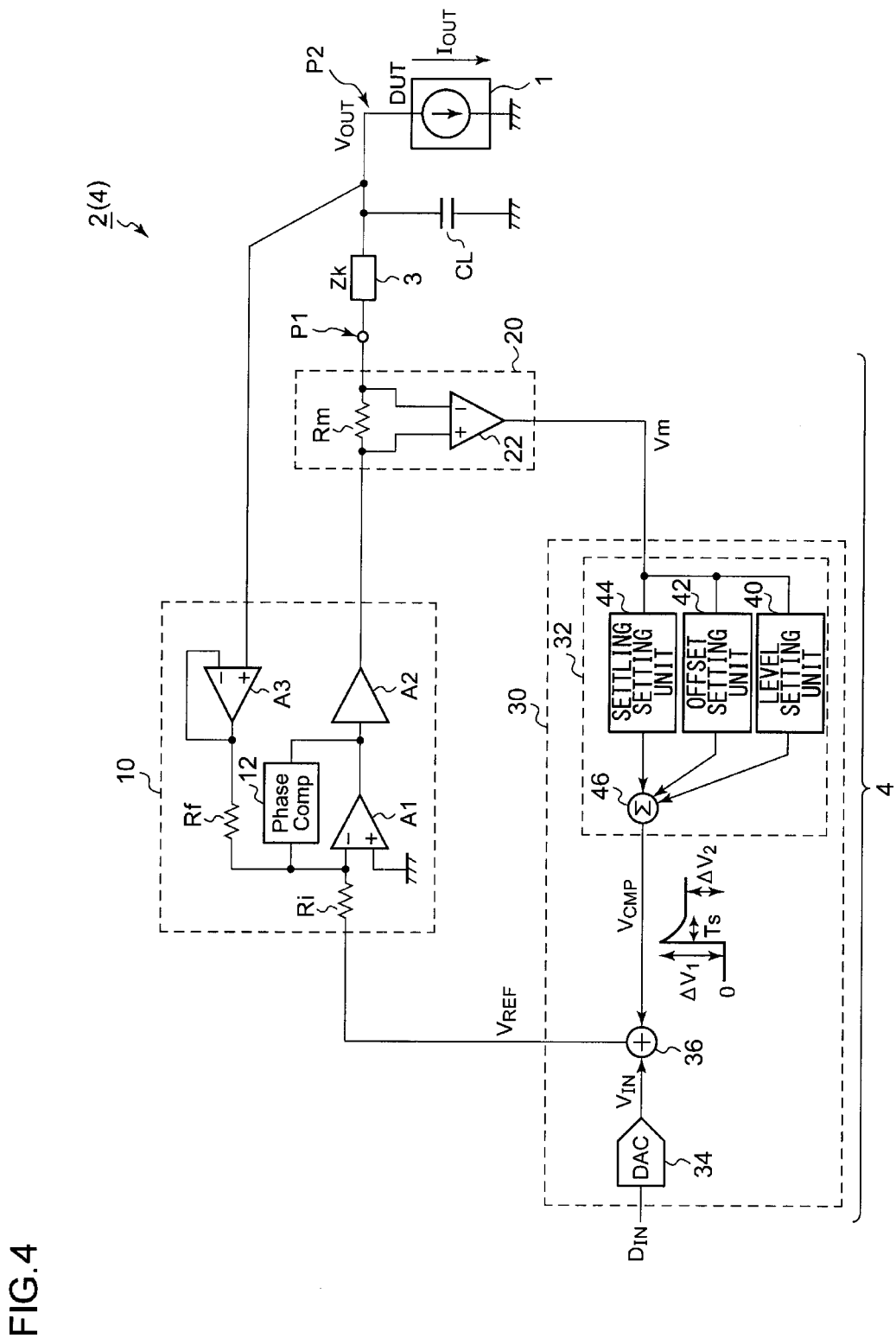
FIG. 4 is a circuit diagram which shows a first example configuration of the power supply apparatus.

FIG. 4 is a circuit diagram which shows a specific example of the power supply apparatus 4.

The voltage source 10 is configured as an inverting amplifier, and includes an input resistor Ri, a feedback resistor Rf, an operational amplifier A1, a buffer A2, a buffer A3, and a phase compensation circuit 12.

The reference voltage $V_{REF}$ is applied to one terminal of the input resistor Ri, and the other terminal of the input resistor Ri is connected to the non-inverting input terminal of the operational amplifier A1. The inverting input terminal of the operational amplifier A1 is grounded. The power supply voltage $V_{OUT}$, which is used as a feedback signal, is applied to one terminal of the feedback resistor Rf via the buffer A3. The other terminal of the feedback resistor Rf is connected to the inverting input terminal of the operational amplifier A1. The phase compensation circuit 12 is arranged as necessary between the output terminal and the inverting input terminal of the operational amplifier A1 in order to improve the stability of the system. The buffer A2 receives the output voltage of the operational amplifier A1, and outputs the output voltage thus received. It should be noted that, in a case in which the operational amplifier A1 has sufficiently high driving performance, there is no need to arrange such a buffer A2.

In the steady state, a relation between the power supply voltage $V_{OUT}$ generated by the voltage source 10 and the reference voltage $V_{REF}$ holds true as follows.

$$V_{OUT} = -Rf/Ri \times V_{REF} \quad (3)$$

In a case in which the power supply voltage $V_{OUT}$ to be generated is positive, the reference voltage $V_{REF}$ is set to a negative voltage. This point should be noted in the description below.

The current detection circuit 20 includes a detection resistor Rm arranged on a path of the output current $I_{OUT}$, and an amplifier 22 configured to amplify the voltage drop that occurs at the detection resistor Rm. The detection voltage Vm thus generated by the amplifier 22 is input to the reference voltage generating circuit 30.

The reference voltage generating circuit 30 includes a correction voltage generating unit 32, a D/A converter 34, and a combining circuit 36.

The correction voltage generating unit 32 generates a correction voltage $V_{CMP}$. The correction voltage $V_{CMP}$ corresponds to the difference between the reference voltage $V_{REF}$ shown in FIG. 3 and the initial voltage level $V_{INIT}$, i.e., the input voltage $V_{IN}$. That is to say, in the initial state, the correction voltage $V_{CMP}$ is zero. After the output current $I_{OUT}$ flows, the correction voltage $V_{CMP}$ transits to a voltage level that corresponds to the first voltage step $\Delta V_1$, following which the correction voltage $V_{CMP}$ transits to a voltage level that corresponds to the second voltage step $\Delta V_2$.

The D/A converter 34 converts a digital instruction value $D_{IN}$ into the input voltage $V_{IN}$. The combining circuit 36 combines (by superimposing) the input voltage $V_{IN}$ with the correction voltage $V_{CMP}$ so as to generate the reference voltage $V_{REF}$.

For example, the correction voltage generating unit 32 includes a level setting unit 40, an offset setting unit 42, a settling setting unit 44, and a combining circuit 46.

The level setting unit 40 sets the first voltage level $V_{L1}$ (or $\Delta V_1$) The offset setting unit 42 sets the second voltage level $VL_2$ (or $\Delta V_2$). The settling setting unit 44 sets the settling time Ts. The combining circuit 46 combines the first voltage level $V_{L1}$, the second voltage level $VL_2$, and the settling time Ts, thereby generating the correction voltage $V_{CMP}$.

Figure 5:
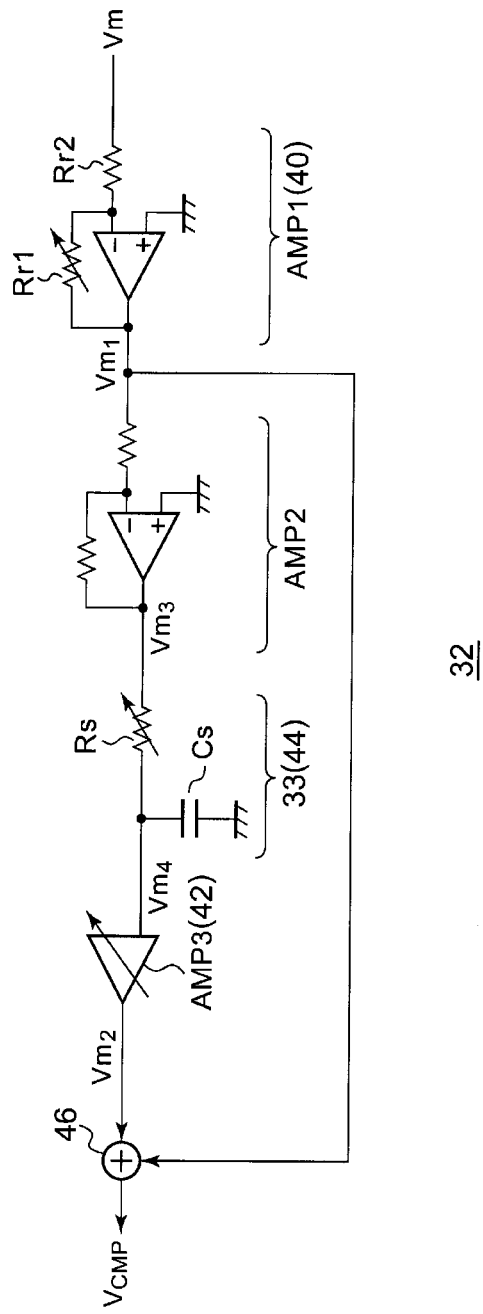
FIG. 5 is a circuit diagram which shows a specific example configuration of a correction voltage generating unit.

FIG. 5 is a circuit diagram which shows a specific example configuration of the correction voltage generating unit 32. The correction voltage generating unit 32 includes a first amplifier AMP1, a second amplifier AMP2, an amplitude adjustment circuit AMP3, a filter 33, and a combining circuit 46.

The first amplifier generates a first voltage $Vm_1$ by multiplying the detection voltage Vm by a first gain. The second amplifier AMP2 inverts the first voltage $Vm_1$. The filter 33 performs filtering of the output voltage $Vm_3$ of the second amplifier AMP2. The filter 33 may be configured as a low-pass filter including a resistor Rs and a capacitor Cs, for example.

The amplitude adjustment circuit AMP3 adjusts the amplitude of the output voltage $Vm_4$ of the filter 33, thereby generating the second voltage $Vm_2$. The combining circuit 46 combines the first voltage $Vm_1$ and the second voltage $Vm_2$ so as to generate the correction voltage $V_{CMP}$.

Figure 6:
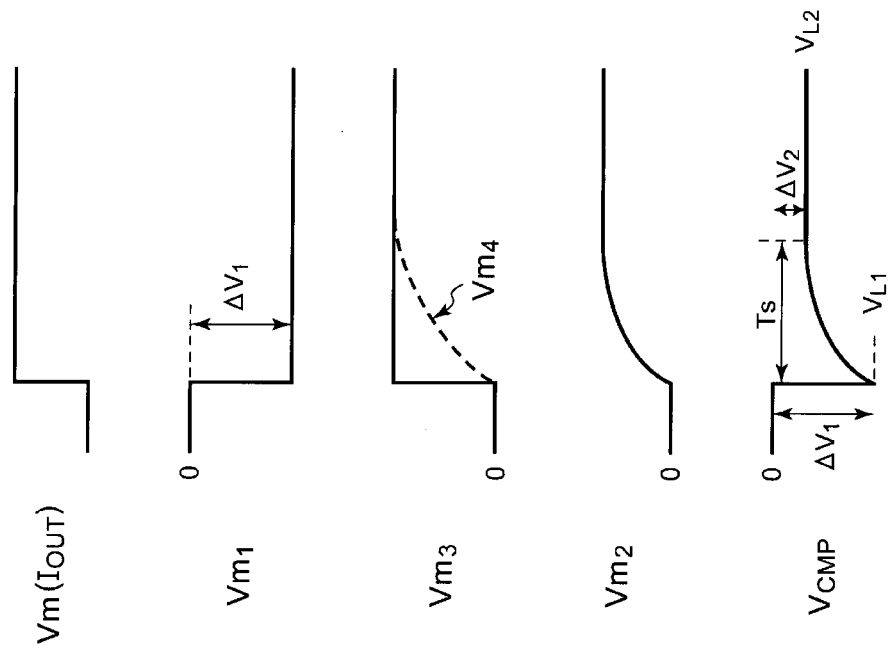
FIG. 6 is a waveform diagram which shows the operation of the correction voltage generating unit shown in FIG. 5.

FIG. 6 is a waveform diagram which shows the operation of the correction voltage generating unit 32 shown in FIG. 5. As shown in FIG. 6, the correction voltage generating unit 32 shown in FIG. 5 is capable of generating the correction voltage $V_{CMP}$. As can be understood from FIGS. 5 and 6, the first amplifier AMP1 corresponds to the level setting unit 40. Furthermore, the amplitude adjustment circuit AMP3 corresponds to the offset setting unit 42. In addition, the filter 33 corresponds to the settling setting unit 44.

It should be noted that, in a case in which the second amplifier AMP2 is configured as a variable gain amplifier, there is no need to provide such an amplitude adjustment circuit AMP3. In this case, the second amplifier AMP2 has a function as the offset setting unit 42.

Figure 7:
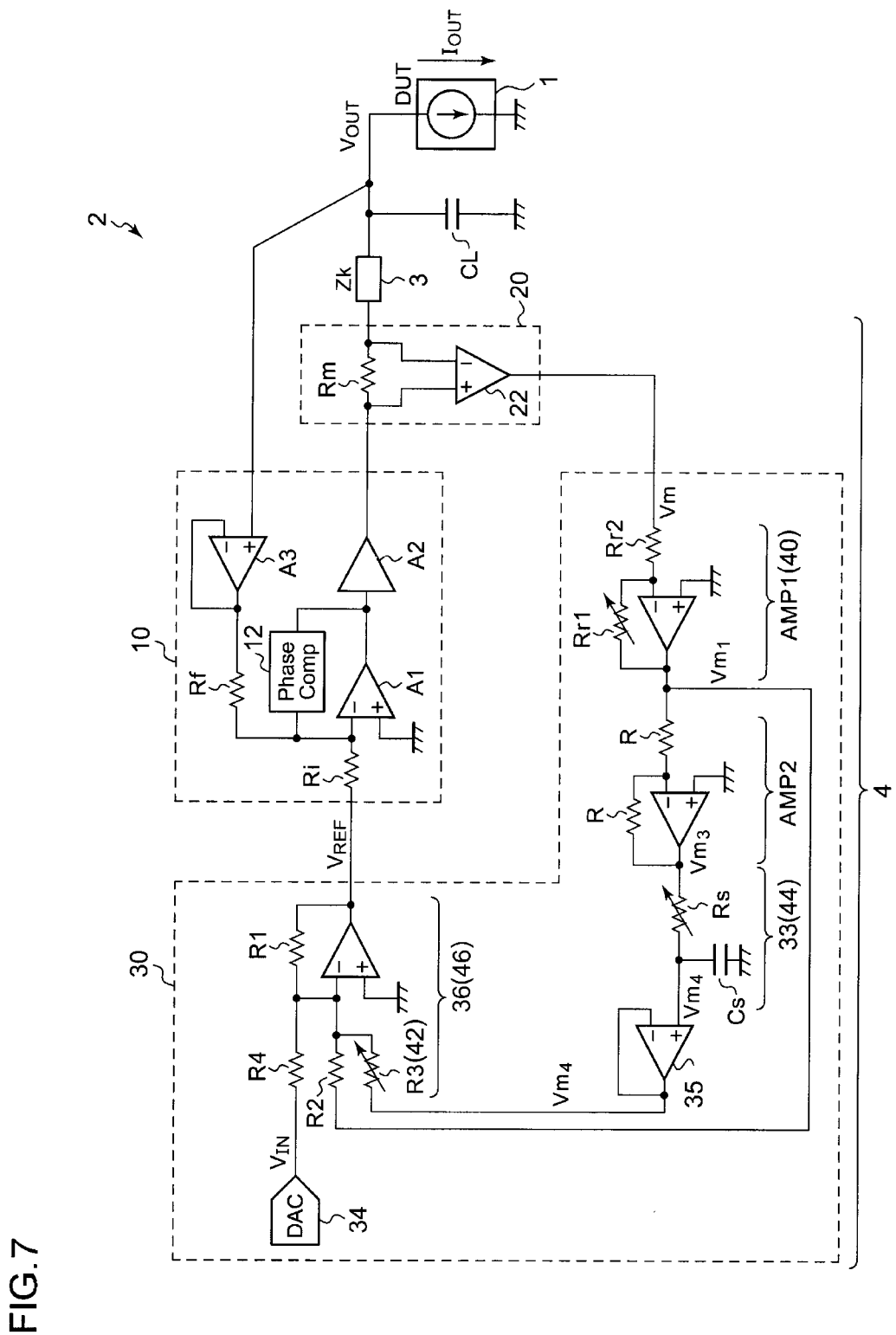
FIG. 7 is a circuit diagram which shows a configuration of a power supply apparatus employing the correction voltage generating unit shown in FIG. 5.

FIG. 7 is a circuit diagram which shows a configuration of the power supply apparatus 4 employing the correction voltage generating unit 32 shown in FIG. 5. In FIG. 7, the combining circuit 36 is configured as an inverting analog adder employing an operational amplifier. The input voltage $V_{IN}$ is input to a resistor R4 included in the combining circuit 36. The first voltage $Vm_1$ output from the first amplifier is input to a resistor R2. The output voltage $Vm_4$ of the filter 33 is input to a resistor R3 via a buffer 35. The following relation expression holds true between the reference voltage $V_{REF}$ and the voltages $V_{IN}$, $Vm_1$, and $Vm_4$.

$$V_{REF}/R1+V_{IN}/R4+Vm_1/R2+Vm_4/R3=0 \quad (4)$$

Thus, the reference voltage $V_{REF}$ is represented by Expression (5).

$$V_{REF}=-R1\times(V_{IN}/R4+Vm_1/R2+Vm_4/R3) \quad (5)$$

That is to say, the combining circuit 36 also has a function as the combining circuit 46 shown in FIG. 5. Furthermore, by configuring the resistor R3 as a variable resistor, such an arrangement is capable of changing the term $Vm_4/R3$. Thus, with such an arrangement, the resistor R3 can be regarded as the amplitude adjustment circuit AMPS shown in FIG. 5, i.e., the offset setting unit 42.

In FIG. 7, the component $V_{REF}'$ of the reference voltage $V_{REF}$ which is a component that corresponds to the detection voltage Vm, can be represented as follows, using a transfer function H(s).

$$V_{REF}'=H(s)\times Vm \quad (6)$$

$$H(s)=K_1-K_2/(1+s\cdot K_3) \quad (7)$$

Here, $K_1=(Rr1\times R1)/(Rr2\times R2)$, $K_2=(Rr1\times R1)/(Rr2\times R3)$, and $K_3=Rs\times Cs$. Furthermore, the component $V_{REF}''$ of the reference voltage $V_{REF}$, which corresponds to the input voltage $V_{IN}$, is represented by Expression (8).

$$V_{REF}''=K4\times V_{IN} \quad (8)$$

Here, $K4=-R4/R1$.

Accordingly, the reference voltage $V_{REF}$ is represented by the following Expression (9).

$$V_{REF}=K4\times V_{IN}+\{K_1-K_2/(1+s\cdot K_3)\}\times Vm \quad (9)$$

The reference voltage generating circuit 30 configured to provide the transfer function H(s) represented by Expression (7) is capable of emulating various kinds of set power supplies by adjusting the parameters $K_1$, $K_2$, and $K_3$.

Description has been made regarding the present invention with reference to the embodiments. The above-described embodiments have been described for exemplary purposes only, and are by no means intended to be interpreted restrictively. Rather, various modifications may be made by making various combinations of the aforementioned components or processes, which are also encompassed in the technical scope of the present invention. Description will be made below regarding such modifications.

Figure 8:
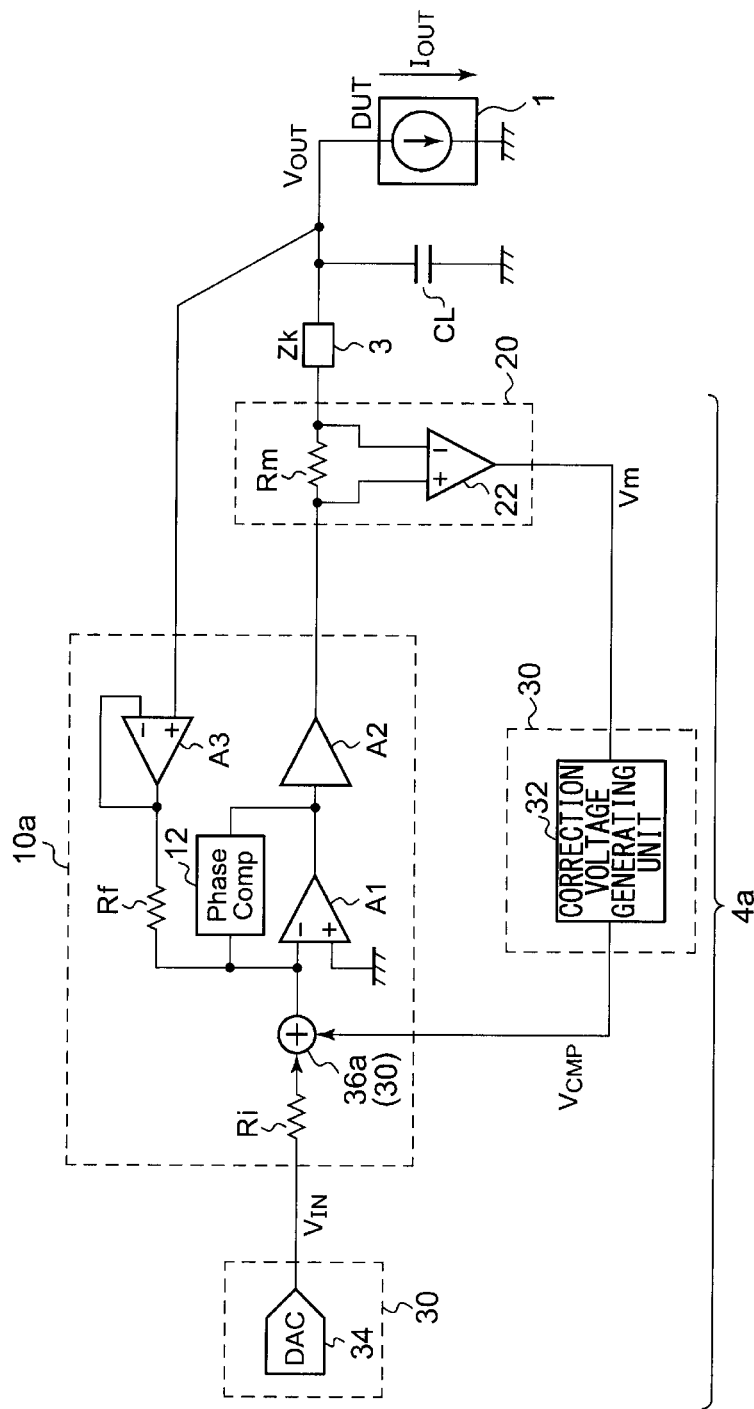
FIG. 8 is a circuit diagram which shows a configuration of a power supply apparatus according to a modification.

FIG. 8 is a circuit diagram which shows a configuration of a power supply apparatus 4a according to a modification. FIG. 8 shows an arrangement in which a combining circuit 36a configured to combine the input voltage $V_{IN}$ and the correction voltage $V_{CMP}$ is arranged between the input resistor Ri and the operational amplifier A1. Such an arrangement also provides the same advantage.

The component configured to superimpose the correction voltage $V_{CMP}$ on the input voltage $V_{IN}$, i.e., the combining circuit 36a, may be arranged on the non-inverting input terminal side of the operational amplifier A1. That is to say, the position of the combining circuit 36 is not restricted in particular, as long as the combining circuit 36 is arranged outside the feedback loop of the voltage source 10a.

Figure 9:
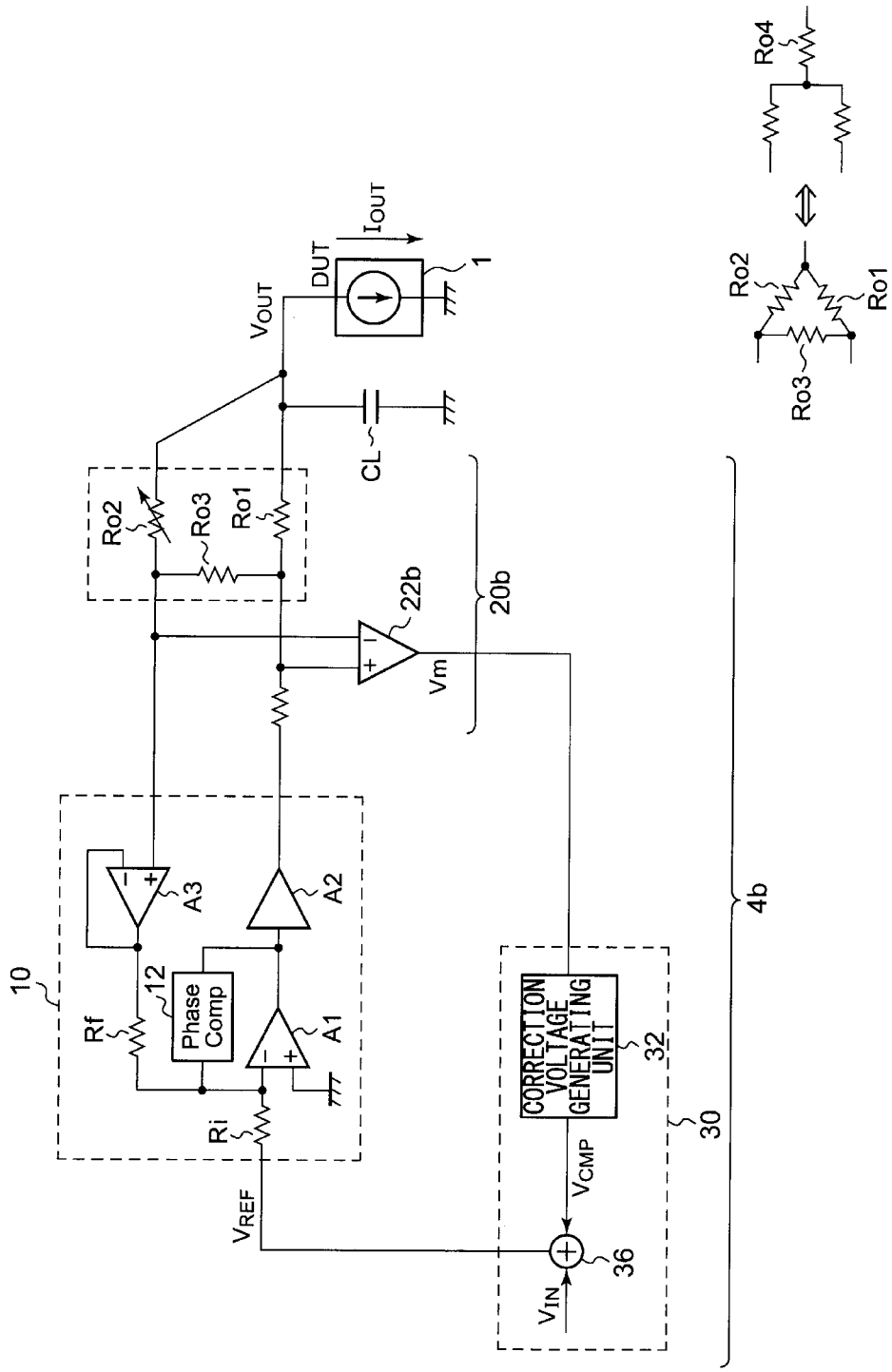
FIG. 9 is a circuit diagram which shows a configuration of a power supply apparatus according to another modification.

FIG. 9 is a circuit diagram which shows a configuration of a power supply apparatus 4b according to another modification. This modification includes a current detection circuit 20b having a different configuration.

The current detection circuit 20b shown in FIG. 9 includes a first output resistor Ro1, a second output resistor Ro2, a third output resistor Ro3, and an amplifier 22b. The output resistor Ro1 is arranged on a path of the output current $I_{OUT}$. The second output resistor Ro2 is configured as a variable resistor, and is arranged on a feedback path via which the power supply voltage $V_{OUT}$ is fed back to the voltage source 10. The third output resistor Ro3 is arranged between one terminal of the first output resistor Ro1 arranged on the voltage source 10 side thereof, and one terminal of the second output resistor Ro2 arranged on the voltage source 10 side thereof. The amplifier 22b amplifies the voltage drop that occurs at the third output resistor Ro3. The resistors Ro1 through Ro3 are delta-connected as shown in FIG. 9, which is equivalent to resistors that are star-connected as shown in the lower part of FIG. 9. In this case, the resistance of a resistor Ro4 is represented by $Ro4=Ro1\times Ro2/(Ro1+Ro2+Ro3)$. Thus, by adjusting the resistance of the second resistor Ro2 arranged on the feedback path, such an arrangement is capable of emulating control of the resistance of the path for the output current $I_{OUT}$. That is to say, such an arrangement is capable of controlling the amount of drop of the output voltage $V_{OUT}$ according to the output current $I_{OUT}$.

Figure 10:
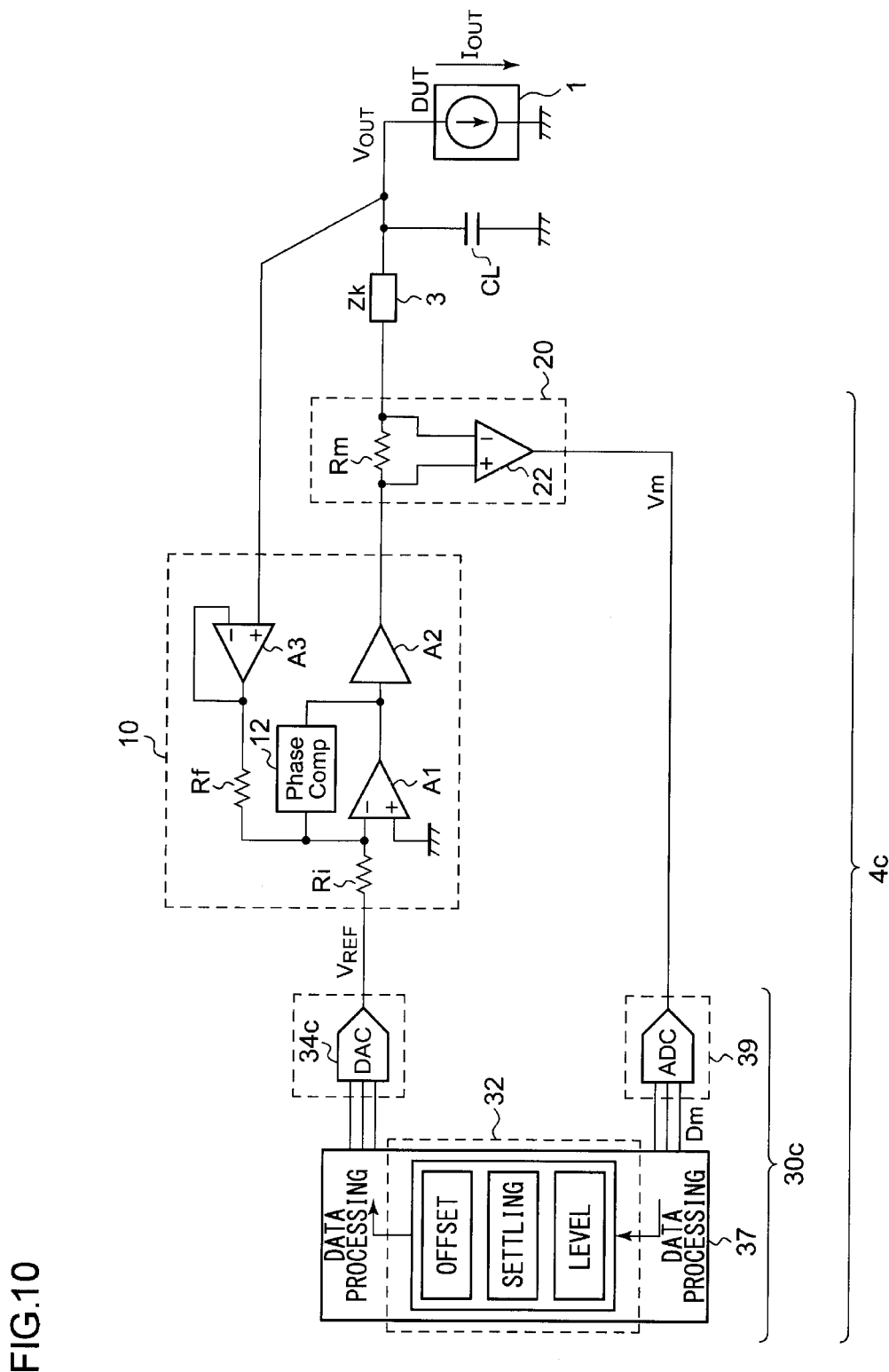
FIG. 10 is a circuit diagram which shows a configuration of a power supply apparatus according to yet another modification.

Description has been made regarding an arrangement configured to generate the reference voltage $V_{REF}$ by means of analog signal processing. Also, an arrangement may be made employing digital signal processing. FIG. 10 is a circuit diagram which shows a configuration of a power supply apparatus 4c according to yet another modification.

The reference voltage generating circuit 30c includes a D/A converter 34c, an A/D converter 39, and a DSP (Digital Signal Processor) 37. The reference voltage generating circuit 30c generates the reference voltage $V_{REF}$ by means of digital signal processing. The A/D converter 39 converts the detection voltage Vm into a digital detection value Dm. The DSP 37 performs signal processing on the digital detection value Dm so as to generate a digital reference value $D_{REF}$ that corresponds to the reference voltage $V_{REF}$. The D/A converter 34c converts the digital reference value $D_{REF}$ into the reference voltage $V_{REF}$ in the form of an analog signal.

The DSP 37 performs the same signal processing as that of the correction voltage generating unit 32 and the combining circuit 36. In the initial state, the digital reference value $D_{REF}$ is set to an initial level. After the output current flows, the digital reference value $D_{REF}$ transits to a first level $D_{L1}$ that is obtained by shifting the initial level $D_{INIT}$ by a first step $\Delta D_1$ that corresponds to the digital detection value Dm. Subsequently, the digital reference value $D_{REF}$ transits to a second level $D_{L2}$ obtained by shifting the initial level $D_{INIT}$ by a second step $\Delta D_2$ that corresponds to the digital detection value Dm.

Such a configuration shown in FIG. 10 also provides the same advantages as those provided with an arrangement configured as an analog circuit.

Description has been made in the embodiment regarding an arrangement in which the voltage source 10 is configured as an inverting amplifier. However, the present invention is not restricted to such an arrangement. Also, the voltage source 10 may be configured as a non-inverting amplifier. Also, the voltage source 10 may be configured as other kinds of power supply circuits, including linear regulators, switching regulators, or the like.

While the preferred embodiments of the present invention have been described using specific terms, such description is for illustrative purposes only, and it is to be understood that changes and variations may be made without departing from the spirit or scope of the appended claims.

The invention claimed is:

1. A power supply apparatus for a test apparatus, configured to supply a power supply voltage to a device under test, the power supply apparatus comprising:
   a voltage source configured to generate the power supply voltage stabilized such that its voltage level matches a voltage level that corresponds to a reference voltage, and to supply the power supply voltage thus generated to the device under test;
   a current detection circuit configured to generate a detection voltage that corresponds to an output current that flows through the device under test; and
   a reference voltage generating circuit configured to generate the reference voltage according to an input voltage and the detection voltage,
   wherein the voltage source comprises:
      an operational amplifier configured to receive a feedback voltage corresponding to the power supply voltage and the reference voltage; and
      a buffer configured to receive an output voltage of the operational amplifier and to output the power supply voltage,
   wherein the reference voltage generating circuit is configured to generate the reference voltage such that, in an initial state, the reference voltage is set to an initial voltage level that corresponds to the input voltage, and such that, after the output current flows, the reference voltage transits to a first voltage level obtained by shifting the initial voltage level by a first voltage step that corresponds to the detection voltage, following which the reference voltage transits to a second voltage level obtained by shifting the initial voltage level by a second voltage step that corresponds to the detection voltage.

2. A power supply apparatus according to claim 1, wherein the reference voltage generating circuit is configured to be capable of adjusting at least one from among the first voltage step and the second voltage step.

3. A power supply apparatus according to claim 1, wherein the reference voltage generating circuit is configured to be capable of adjusting the settling time required for the reference voltage to transit from the first voltage level to the second voltage level.

4. A power supply apparatus according to claim 1, wherein the reference voltage generating circuit comprises a correction voltage generating unit configured to generate a correction voltage which is set to zero in the initial state, and which transits such that, after the output current flows, the correction voltage transits to a voltage level that corresponds to the first voltage step, following which the correction voltage transits to a voltage level that corresponds to the second voltage step, and wherein the reference voltage is generated by combining the input voltage and the correction voltage.

5. A power supply apparatus according to claim 1, wherein the reference voltage generating circuit comprises:
   a level setting unit configured to set the first voltage level;
   an offset setting unit configured to set the second voltage level; and
   a settling setting unit configured to set a settling time required for the reference voltage to transit from the first voltage level to the second voltage level.

6. A power supply apparatus according to claim 1, wherein the reference voltage generating circuit comprises:
   a first amplifier configured to generate a first voltage that corresponds to the detection voltage;
   a second amplifier configured to invert the first voltage; and
   a filter configured to perform filtering of an output voltage of the second amplifier so as to generate a second voltage,
   wherein the reference voltage generating circuit is configured to generate the reference voltage by combining the input voltage, the first voltage, and the second voltage.

7. A power supply apparatus for a test apparatus, configured to supply a power supply voltage to a device under test, the power supply apparatus comprising:
   a voltage source configured to generate the power supply voltage stabilized such that its voltage level matches a voltage level that corresponds to a reference voltage, and to supply the power supply voltage thus generated to the device under test;
   a current detection circuit configured to generate a detection voltage that corresponds to an output current that flows through the device under test; and
   a reference voltage generating circuit configured to receive an input voltage and the detection voltage, and to generate the reference voltage,
   wherein, with the component of the reference voltage that corresponds to the detection voltage as $V_{REF}'$, the reference voltage generating circuit is configured to provide a transfer function H(s) represented by $V_{REF}'=H(s) \times Vm=(K_1-K_2/(1+s \cdot K_3)) \times Vm$, where Vm represents the detection voltage, and $K_1$, $K_2$, and $K_3$ each represent a coefficient.

8. A power supply apparatus according to claim 7, wherein at least one from among the coefficients $K_1$, $K_2$, and $K_3$ is configured to be variable.

9. A power supply apparatus for a test apparatus, configured to supply a power supply voltage to a device under test, the power supply apparatus comprising:

a voltage source configured to generate the power supply voltage stabilized such that its voltage level matches a voltage level that corresponds to a reference voltage, and to supply the power supply voltage thus generated to the device under test;

a current detection circuit configured to generate a detection voltage that corresponds to an output current that flows through the device under test; and a reference voltage generating circuit configured to generate the reference voltage, wherein the voltage source comprises:

an operational amplifier configured to receive a feedback voltage corresponding to the power supply voltage and the reference voltage; and a buffer configured to receive an output voltage of the operational amplifier and to output the power supply voltage, and wherein the reference voltage generating circuit comprises an A/D converter configured to convert the detection voltage into a digital detection value, a signal processing unit configured to perform signal processing on the digital detection value so as to generate a digital reference value that corresponds to the reference voltage, and a D/A converter configured to convert the digital reference value into the reference voltage in the form of an analog signal, and wherein the signal processing unit is configured to generate the digital reference value such that, in the initial state, the digital reference value is set to an initial level, and such that, after the output current flows, the digital reference value transits to a first level obtained by shifting the initial level by a first step that corresponds to the digital detection value, following which it transits to a second level obtained by shifting the initial level by a second step that corresponds to the digital detection value.

10. A power supply apparatus according to claim 9, wherein the signal processing unit is configured to be capable of adjusting at least one from among the first step and the second step.

11. A power supply apparatus according to claim 9, wherein the signal processing unit is configured to be capable of adjusting the settling time required for the reference voltage to transit from the first level to the voltage level.

12. A power supply apparatus according to claim 1, wherein the current detection circuit comprises:

a first output resistor arranged on a path for the output current;

a second output resistor arranged on a path via which the power supply voltage is fed back to the voltage source;

a third output resistor arranged between one terminal of the first output resistor on the voltage source side thereof and one terminal of the second output resistor on the voltage source side thereof; and an amplifier configured to amplify the voltage drop that occurs at the third output resistor.

13. A power supply apparatus according to claim 12, wherein the second output resistor is configured as a variable resistor.

14. A test apparatus comprising a power supply apparatus configured to supply electric power to a device under test, wherein the power supply apparatus comprises:

a voltage source configured to generate the power supply voltage stabilized such that its voltage level matches a voltage level that corresponds to a reference voltage, and to supply the power supply voltage thus generated to the device under test;

a current detection circuit configured to generate a detection voltage that corresponds to an output current that flows through the device under test; and a reference voltage generating circuit configured to generate the reference voltage according to an input voltage and the detection voltage, wherein the voltage source comprises:

an operational amplifier configured to receive a feedback voltage corresponding to the power supply voltage and the reference voltage; and a buffer configured to receive an output voltage of the operational amplifier and to output the power supply voltage, and wherein the reference voltage generating circuit is configured to generate the reference voltage such that, in an initial state, the reference voltage is set to an initial voltage level that corresponds to the input voltage, and such that, after the output current flows, the reference voltage transits to a first voltage level obtained by shifting the initial voltage level by a first voltage step that corresponds to the detection voltage, following which the reference voltage transits to a second voltage level obtained by shifting the initial voltage level by a second voltage step that corresponds to the detection voltage.

15. A power supply apparatus according to claim 7, wherein the current detection circuit comprises:

a first output resistor arranged on a path for the output current;

a second output resistor arranged on a path via which the power supply voltage is fed back to the voltage source;

a third output resistor arranged between one terminal of the first output resistor on the voltage source side thereof and one terminal of the second output resistor on the voltage source side thereof; and an amplifier configured to amplify the voltage drop that occurs at the third output resistor.

16. A power supply apparatus according to claim 15, wherein the second output resistor is configured as a variable resistor.

17. A test apparatus comprising a power supply apparatus configured to supply electric power to a device under test, wherein the power supply apparatus comprises:

a voltage source configured to generate the power supply voltage stabilized such that its voltage level matches a voltage level that corresponds to a reference voltage, and to supply the power supply voltage thus generated to the device under test;

a current detection circuit configured to generate a detection voltage that corresponds to an output current that flows through the device under test; and a reference voltage generating circuit configured to receive an input voltage and the detection voltage, and to generate the reference voltage, wherein, with the component of the reference voltage that corresponds to the detection voltage as $V_{REF}'$, the reference voltage generating circuit is configured to provide a transfer function $H(s)$ represented by $V_{REF}'=H(s)\times Vm=(K_1-K_2/(1+s \cdot K_3))\times Vm$, where $Vm$ represents the detection voltage, and $K_1$, $K_2$, and $K_3$ each represent a coefficient.

18. A power supply apparatus according to claim 9, wherein the current detection circuit comprises:

a first output resistor arranged on a path for the output current;

a second output resistor arranged on a path via which the power supply voltage is fed back to the voltage source;

a third output resistor arranged between one terminal of the first output resistor on the voltage source side thereof and one terminal of the second output resistor on the voltage source side thereof; and an amplifier configured to amplify the voltage drop that occurs at the third output resistor.

19. A power supply apparatus according to claim 18, wherein the second output resistor is configured as a variable resistor.

20. A test apparatus comprising a power supply apparatus configured to supply electric power to a device under test, wherein the power supply apparatus comprises:

a voltage source configured to generate the power supply voltage stabilized such that its voltage level matches a voltage level that corresponds to a reference voltage, and to supply the power supply voltage thus generated to the device under test;

a current detection circuit configured to generate a detection voltage that corresponds to an output current that flows through the device under test; and a reference voltage generating circuit configured to generate the reference voltage, wherein the voltage source comprises:

an operational amplifier configured to receive a feedback voltage corresponding to the power supply voltage and the reference voltage; and a buffer configured to receive an output voltage of the operational amplifier and to output the power supply voltage, and wherein the reference voltage generating circuit comprises an A/D converter configured to convert the detection voltage into a digital detection value, a signal processing unit configured to perform signal processing on the digital detection value so as to generate a digital reference value that corresponds to the reference voltage, and a D/A converter configured to convert the digital reference value into the reference voltage in the form of an analog signal, and wherein the signal processing unit is configured to generate the digital reference value such that, in the initial state, the digital reference value is set to an initial level, and such that, after the output current flows, the digital reference value transits to a first level obtained by shifting the initial level by a first step that corresponds to the digital detection value, following which it transits to a second level obtained by shifting the initial level by a second step that corresponds to the digital detection value.

* * * * *